(12) United States Patent
Pfaffinger et al.

(10) Patent No.: US 9,350,314 B2
(45) Date of Patent: May 24, 2016

(54) AMPLIFIER CURRENT CONSUMPTION CONTROL

(75) Inventors: Gerhard Pfaffinger, Regensburg (DE); Franz Lorenz, Straubing (DE); Stefan Zuckmantel, Neufahrn (DE); Markus Christoph, Straubing (DE)

(73) Assignee: Harman Becker Automotive Systems GmbH, Karlsbad (DE)

( * ) Notice: Subject to any disclaimer, the term of this patent is extended or adjusted under 35 U.S.C. 154(b) by 768 days.

(21) Appl. No.: 13/333,468

(22) Filed: Dec. 21, 2011

(65) Prior Publication Data
US 2012/0154037 A1 Jun. 21, 2012

(30) Foreign Application Priority Data

Dec. 21, 2010 (EP) .................................. 10196153

(51) Int. Cl.
*H04R 29/00* (2006.01)
*H03G 7/00* (2006.01)

(52) U.S. Cl.
CPC ..................................... *H03G 7/007* (2013.01)

(58) Field of Classification Search
CPC ............... H03F 3/68; H03F 1/32; H03F 1/30; H03F 1/34; H03F 1/38; H03F 1/42; H03F 1/52; H03F 9/09; H03F 9/04; H03F 9/06; H03F 2200/03; H03F 2200/102; H03F 2200/105; H03F 2200/165; H03F 2200/511; H03F 2200/468; H03F 2200/471; H03F 2200/465; H03F 2200/462; H03F 2200/441; H03F 2200/435; H03F 2200/426; H03F 2200/428; H03F 2200/393; H03F 2200/486; H04R 3/007; H04R 3/12

USPC ........ 381/28, 55, 71.12, 84, 86, 302, 93, 102, 381/100, 106, 107, 108, 120, 56, 57, 59, 60, 381/121, 119; 330/102–105, 278, 279, 280, 330/282, 123, 127–142, 296, 297
See application file for complete search history.

(56) References Cited

U.S. PATENT DOCUMENTS

| 5,548,650 A | 8/1996 | Clark |
| 2003/0164735 A1 | 9/2003 | Julien et al. |

(Continued)

FOREIGN PATENT DOCUMENTS

| CN | 1639966 A | 7/2005 |
| EP | 1471767 A2 | 10/2004 |

(Continued)

OTHER PUBLICATIONS

European Search Report for corresponding Application No. 10196153.0, mailed May 23, 2011, 6 pages.

(Continued)

*Primary Examiner* — Leshui Zhang
(74) *Attorney, Agent, or Firm* — Brooks Kushman P.C.

(57) ABSTRACT

The audio amplifier includes a variable gain amplifier receiving the input audio signal and providing the output signal, whereby the output signal corresponds to the input signal amplified by a limiter gain. The audio amplifier further includes a limiter gain calculation unit, thus the input signal is amplified by the limiter gain. A control unit receives a signal representative of the input signal and is configured to estimate, based on a mathematical model, the input current or the total output current of the audio amplifier thus providing an estimated current signal corresponding to (and resulting from) the output signal, whereby the limiter gain calculation unit is configured to calculate, dependent on the estimation, the limiter gain such that the actual input current or the total output current of the audio amplifier does not exceed a threshold current value.

14 Claims, 4 Drawing Sheets

(56) References Cited

U.S. PATENT DOCUMENTS

| | | |
|---|---|---|
| 2004/0178852 A1 | 9/2004 | Neunaber |
| 2004/0234079 A1 | 11/2004 | Schneider et al. |
| 2005/0163324 A1* | 7/2005 | Neunaber ............... 381/55 |
| 2008/0056504 A1* | 3/2008 | Gorges et al. ............ 381/55 |
| 2009/0009251 A1 | 1/2009 | Spielbauer |
| 2009/0067654 A1* | 3/2009 | Klinkby et al. .......... 381/318 |
| 2009/0161889 A1* | 6/2009 | Magrath ............... 381/107 |
| 2011/0228945 A1* | 9/2011 | Mihelich et al. ......... 381/59 |

FOREIGN PATENT DOCUMENTS

| | | |
|---|---|---|
| EP | 2009786 A1 | 12/2008 |
| JP | H02237214 A | 9/1990 |
| JP | H097300 A | 1/1997 |
| JP | 2002-198756 | 7/2002 |
| JP | 2009-206869 | 9/2009 |
| JP | 2009-253955 | 10/2009 |

OTHER PUBLICATIONS

European Office Action for corresponding Application No. 10196153.0, mailed Feb. 28, 2013, 5 pages.

Japanese Office Action and English translation for corresponding Application No. 2011-207957, mailed Mar. 22, 2013, 7 pages.

Chinese Office Action for corresponding Application No. 201110432182.6, mailed Jun. 18, 2014, 5 pages.

Chinese Office Action for corresponding Application No. 201110432182.6, mailed Jan. 6, 2014, 7 pages.

* cited by examiner

US 9,350,314 B2

AMPLIFIER CURRENT CONSUMPTION CONTROL

CLAIM OF PRIORITY

This patent application claims priority from EP Application No. 10 196 153.0 filed Dec. 21, 2010, which is hereby incorporated by reference.

FIELD OF TECHNOLOGY

The present invention relates to audio amplifiers, in particular to a limiter for controlling the current consumption of an audio amplifier.

RELATED ART

In mobile applications, in particular in automotive applications, power consumption of audio amplifiers is often an issue that affects the power supply of the overall mobile entity.

For example, in automobiles the on board power supply usually provides a nominal supply voltage of 12 V that results in a significantly high input current consumption of electrical loads such as audio amplifiers whose nominal power consumption may be 1000 W or even more. A higher on board supply voltage (e.g., 42 V), would alleviate the problem and reduce the input current consumption and has been in discussion for years but, it could not yet be established as standard in automotive applications. As a consequence, the supply lines of electrical loads such as audio amplifiers have to have significantly large cross sections (or diameters) in order to reduce their ohmic resistance and prevent overheating or even melting of the supply lines. Thick supply lines increase weight and fuel consumption of the vehicle, both being undesired consequences.

In order to avoid an over-current in the supply lines a strict maximum current consumption is specified for each electrical load whereby the maximum acceptable current may depend on the total number of active loads in the vehicle, the battery charge condition, etc. Other influencing factors may be relevant. As far as audio equipment is concerned suppliers have to comply with requirements related to the maximum output current of the amplifier. As the input current consumption of an audio amplifier is a direct result of the respective audio channel output currents current limits may be either specified for the input current or for the output current.

The actual current consumption of audio amplifiers largely depends on user settings (e.g., bass, volume, etc.) as well as on the reproduced audio signal (e.g., voice signal, music with dominating bass, etc). Thus, there is a need for an audio amplifier capable to monitor and control its input current consumption and/or its output currents.

SUMMARY OF THE INVENTION

An audio amplifier includes a variable gain amplifier receiving the input audio signal and providing the output signal, whereby the output signal corresponds to the input signal amplified by a limiter gain. The audio amplifier also includes a limiter gain calculation unit, thus the input signal is amplified by the limiter gain. A control unit receives a signal representative of the input signal and is configured to estimate, based on a mathematical model, the input current or the total output current of the audio amplifier thus providing an estimated current signal corresponding to (and resulting from) the output signal, whereby the limiter gain calculation unit calculates, dependent on the estimation, the limiter gain such that the actual input current or the total output current of the audio amplifier does not exceed a threshold current value.

These and other objects, features and advantages of the present invention will become apparent in the detailed description of the best mode embodiment thereof, as illustrated in the accompanying drawings. In the figures, like reference numerals designate corresponding parts.

DESCRIPTION OF THE DRAWINGS

The invention can be better understood with reference to the following drawings and description. The components in the figures are not necessarily to scale, instead emphasis being placed upon illustrating the principles of the invention. Moreover, in the figures, like reference numerals designate corresponding parts. In the drawings.

DETAILED DESCRIPTION OF THE INVENTION

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

It has to be noted that in the further discussion (audio) signals are illustrated as discrete time signals. A signal a[n] illustrates a general discrete time signal with a time index n denoting the discrete sampling time. Further it has to be noted that only these components of the depicted systems which are relevant for the further discussion are included in the figures. Analog-to-digital converters, digital-to-analog converters, power amplifiers and other components which may be necessary for signal transmission and audio signal reproduction are not shown for the sake of simplicity.

Figure 1:
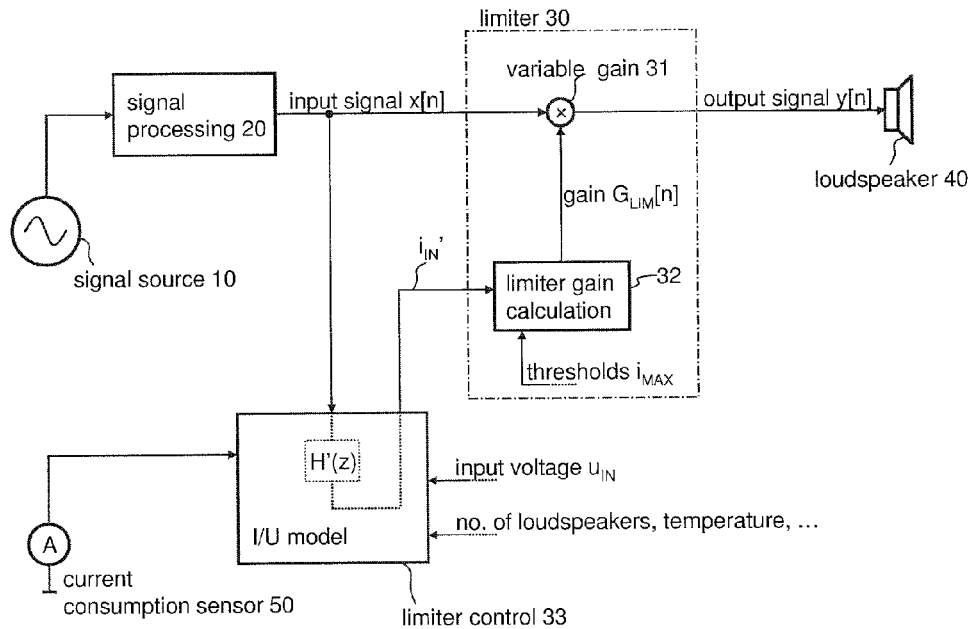
FIG. 1 is a block diagram illustration of an audio system whereby only one output channel is shown for the sake of simplicity.

FIG. 1 is a block diagram illustration of an audio system in accordance with one example of the invention whereby only one output channel is shown for the sake of simplicity. However, the principle illustrated in the example of FIG. 1 can readily be generalized to multiple audio channels. An input signal x[n] (associated with a certain audio channel) is generated by a signal source 10 and may be pre-processed by a signal processing unit 20. That is, the actual input signal x[n] is provided at an output of the signal processing unit 20 for further processing. The signal processing unit 20 typically performs various signal processing tasks such as the equalization of the audio signal, surround sound processing or the like. However, the details of the pre-processing are not essential for the further discussion.

The input signal $x[n]$ is amplified by a variable gain referred to as "limiter gain" $G_{LIM}[n]$ whose value may be updated each sampling interval. The resulting output signal $y[n]$ may thus expressed as $y[n]=x[n]\cdot G_{LIM}[n]$. The output signal $y[n]$ is forwarded to the loudspeaker 40, via an D/A converter and a power amplifier stage, where it is converted in a corresponding acoustic audio signal.

The limiter gain $G_{LIM}[n]$ is calculated by a limiter gain calculation unit 32 from a predicted current signal $i_{IN}'$ representative of the input current consumption (i.e., predicted total input current consumption of the amplifier or, alternatively, predicted total output current provided by the amplifier output stage) and from a current threshold $i_{MAX}$ defining the desired maximum current (i.e., input current consumption or, alternatively, maximum output current). The limiter gain $G_{LIM}[n]$ is calculated such that the actual input current $i_{IN}$ (or output current) will not exceed the current threshold $i_{MAX}$. However, a short transient over-current might be acceptable depending on the actual application. The variable gain amplifier 31 and the limiter gain calculation unit 32 may be together regarded as limiter 30. It should be noted that in the following description, the input current $i_{IN}$ is predicted and compared to a respective current threshold defining a maximum input current consumption. As already mentioned above, a corresponding current threshold may be defined for the total output current of the amplifier which would require to predict the total output current. In the following description the input current consumption $i_{IN}'$ is predicted, however, it will be understood that such input current estimate $i_{IN}'$ may easily be converted into a corresponding output current estimate as the total output current and the input current consumption are approximately proportional in practical audio amplifier implementations.

When predicting a future input current $i_{IN}'$ value (resulting from the actually present input signal $x[n]$) a nominal limiter gain value (e.g., $G_{LIM}=1$) is assumed. Predicting an overcurrent $i_{IN}'>i_{MAX}$ allows for reducing the limiter gain $G_{LIM}[n]$ (e.g., to values lower than unity) before the actual input current $i_{IN}$ actually reaches the predicted value $i_{IN}'$. Alternatively, when a future output current value is to be predicted, the actual prediction may be performed using input current information resulting in an estimate for the input current that can be converted to an estimate for the output current.

For the further discussion one aspect is the calculation (i.e., the estimation, also referred to as prediction) of an input current $i_{IN}'[n+1]$ (or alternatively an output current) resulting from a given input signal $x[n]$. Such prediction makes use of the actual input or output current information provided by one or more current sensors such as by a input current consumption sensor 50 illustrated in FIG. 1. In the example of FIG. 1 this calculation is performed by a control unit 33 that includes a mathematical model describing the relationship between influencing variables such as the actual supply voltage $u_{IN}$ of the audio amplifier, the audio input signal $x[n]$ to be reproduced, the number of active loudspeakers, the temperature of the amplifier output stage, etc. and the resulting input current $i_{IN}$ (or output current). Various other influencing variables might be considered, too. For enabling an ongoing estimation (prediction) the current sensor 50 may be provided to supply a signal representing the actual input current $i_{IN}[n]$ to the control unit 33.

Figure 2:
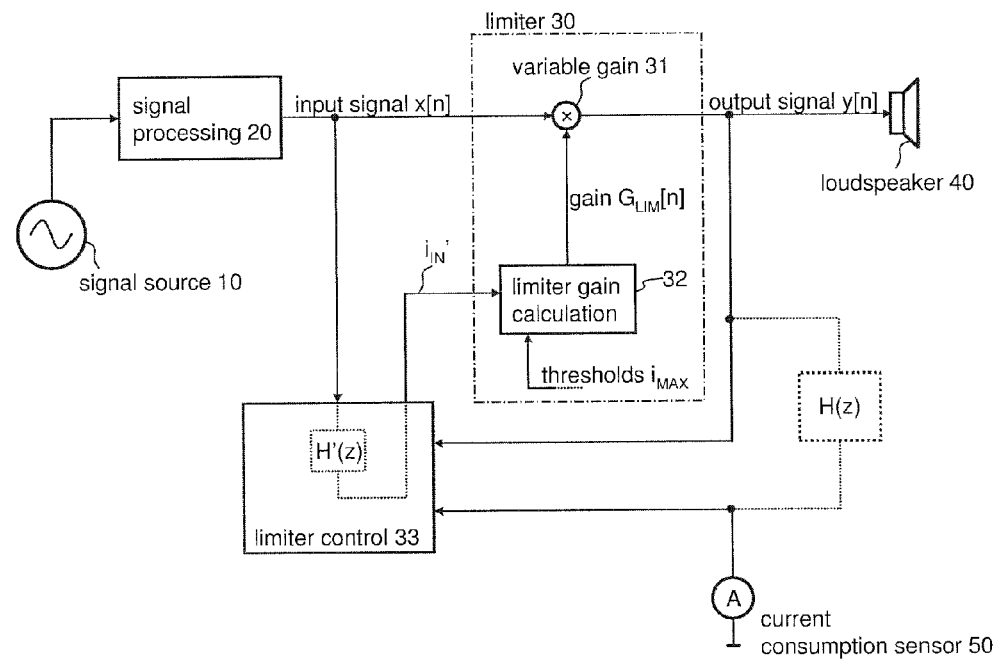
FIG. 2 is a block diagram of an alternative embodiment audio system.
Figure 3:
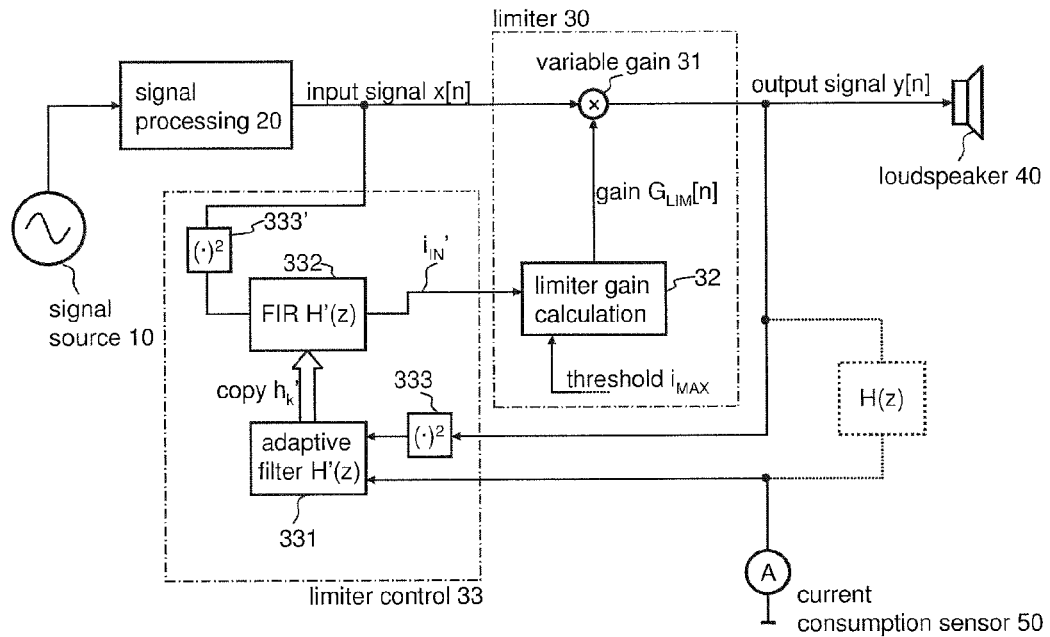
FIG. 3 illustrates the example of FIG. 2 in more detail.
Figure 4:
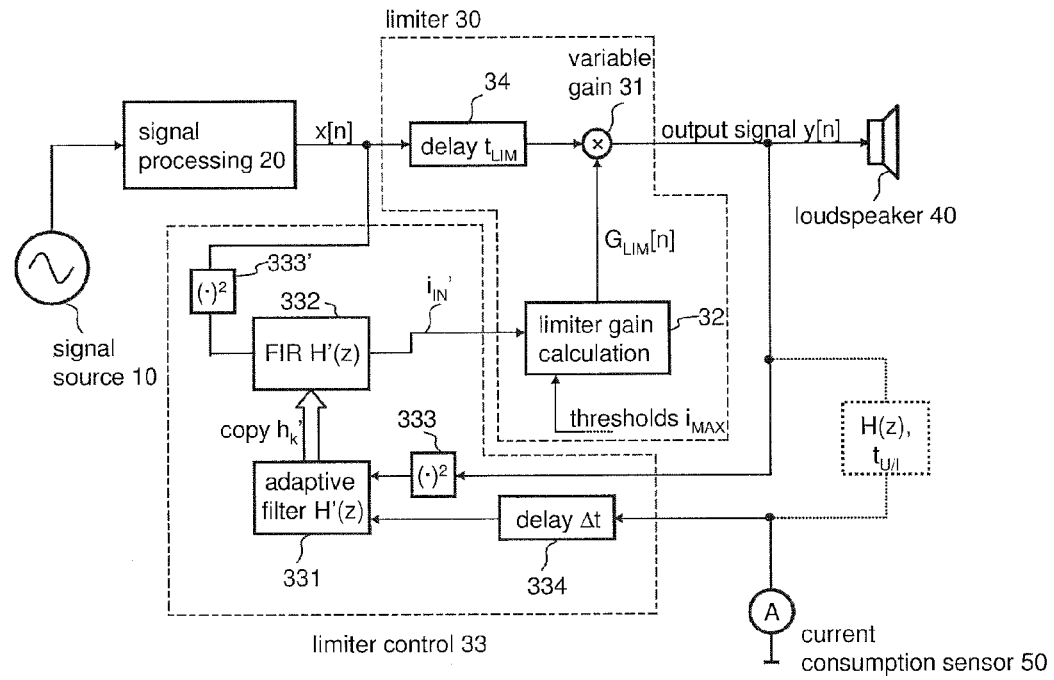
FIG. 4 illustrates the example of FIG. 3 in more detail.

FIGS. 2 to 4 illustrate the principle and the details of one possible way of estimating the impending input current $i_{IN}'[n+1]$ from the current values of the input signal $x[n]$, the (amplified) output signal $y[n]$, and a measured input current sensor signal representing the current input current signal $i_{IN}[n]$ (e.g., stemming from current consumption sensor 50).

As mentioned above, the corresponding output current may be estimated as an alternative. FIG. 2 illustrates the control unit 33 receiving the above mentioned signals $x[n]$, $y[n]$, and $i_{IN}[n]$. Further, FIG. 2 illustrates the transfer function $H(z)$ describing the transfer characteristics from the output signal $y[n]$ (output by the loudspeaker 40 via a power amplifier output stage) to the input current $i_{IN}[n]$ sensed by the current sensor 50. The mentioned transfer characteristics may be estimated by the control unit 33 during operation of the audio amplifier and the corresponding estimated transfer function $H'(z)$ may be used to calculate, from the input signal $x[n]$, an estimation for the impending input current $i_{IN}'[n+1]$. This is possible because $H'(z)$ has a low pass characteristics and always includes a delay, further denoted as delay time $t_H$ (e.g., the delay between a peak in signal $y[n]$ and a corresponding peak in the input current $i_{IN}[n]$). At this point it should be remembered that the system $H(z)$ is regarded as discrete time system in the present discussion as a digital implementation of the control unit 33 seems to be advantageous. However, at least partially analog implementations might be applicable as well.

FIG. 3 illustrates, as one example of the present invention, a useful implementation for estimating the transfer characteristics of the system $H(z)$. An adaptive filter 331 may be implemented in the control unit (e.g., as an adaptive FIR filter) which receives, as input, the output signal $y[n]$ and, as reference, the measured input current $i_{IN}[n]$. As the input current $i_{IN}[n]$ is always positive (regardless of whether the output signal $y[n]$ has positive or negative values) the output signal $y[n]$ may be subject to a positive definite transformation before being supplied to the adaptive filter 331. For example, the squared output signal $y[n]^2$ or the absolute signal values $|y[n]|$ may be supplied to the adaptive filter 331. The transfer function $H(z)$ usually represents a simple low pass characteristics, as low frequency sound requires a high sound pressure level so as to be acoustically perceivable. The adaptive filter $H'(z)$ (filter 331) usually does not change its coefficients quickly, as the transfer characteristics of the output signal $y[n]$ to the input current $i_{IN}[n]$ (or alternatively to the output current) usually changes only gradually. The actual current estimate $i_{IN}'[n+1]$ is calculated by filtering the (optionally squared) input signal $x[n]$ using a filter 332 which is a (optionally scaled by factor $G_{LIM}[n]$ to avoid a continuous recalibration of $h_k[n]$) copy of the filter coefficients provided by the adaptive filter 331. In the example of FIG. 3 the filter 332 implements the same filter coefficients $h_k[n]$ as the adaptive filter 331, and thus the current estimate at the output of the filter 332 is scaled by a scaling factor equal to the current limiter gain $G_{LIM}[n]$. However, as the current limiter gain is "known" by the limiter gain calculation unit, such scaling can be considered in the calculation of the updated limiter gain $G_{LIM}[n+1]$.

As illustrated in FIG. 4, the limiter 30 (composed of, inter alia, variable gain amplifier 31 and limiter gain calculation unit 32) may further include a delay $t_{LIM}$ that may be lumped into the delay unit 34 for the purpose of mathematical modeling. The delay $t_{LIM}$ is typically greater than one millisecond for feed forward limiters in practical implementations. This delay may adversely affect the adaptation behavior of the adaptive filter 331 as the signal $y[n]$ reaches the filter 331 after the resulting current signal $i_{IN}[n]$. To avoid this, a delay line 334 (delay $\Delta t \geq t_{LIM}-t_H$) has to be included between the current sensor 50 and the adaptive filter 331 so as to delay the current sense signal $i_{IN}[n]$ received by the adaptive filter. The respective delay should be at least as large as the difference between the limiter delay $t_{LIM}$ and the dead time $t_H$ of system $H(z)$.

It may be worth noting that the output signal y[n] should be tapped so as to be supplied to the adaptive filter (after having been squared, see FIG. 4). In theory, also the input signal x[n] might be tapped instead for the same purpose. In the latter case, however, the resulting adaptive filter would be permanently rescaled in response to a change of the limiter gain $G_{LIM}[n]$ whereas, once having converged, the coefficients of the adaptive filter 331 remain almost constant when taking the signal y[n] as input. The current limiter gain value $G_{LIM}[n]$ might instead be considered in the gain calculation unit 32.

Figure 5:
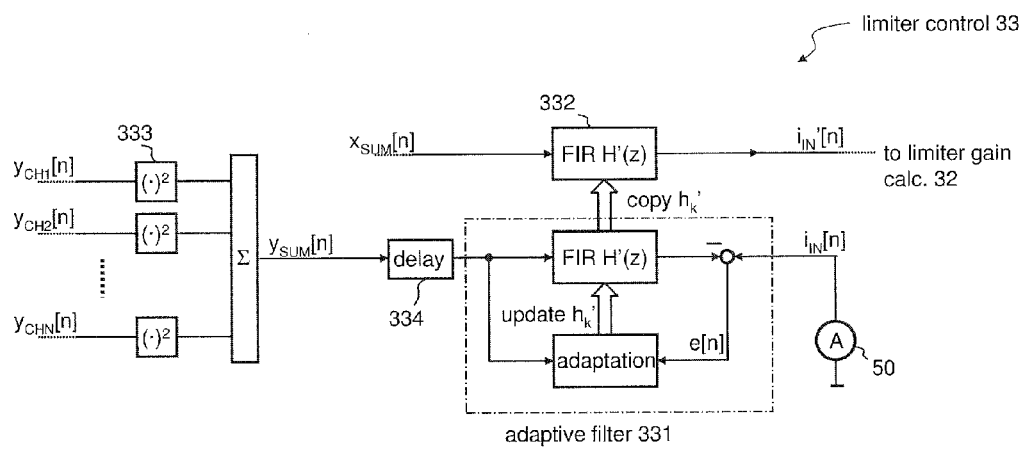
FIG. 5 illustrates one example of the adaptive filter used in the examples of FIGS. 3 and 4.

A real world audio system typically has more than one output signal y[n], typically at least two. In the following the output signal of each channel is labeled with the index CH1, CH2, etc., that is $y_{CH1}[n], y_{CH2}[n], \ldots, y_{CHN}[n]$. Each of the output signals $y_{CH1}[n], y_{CH2}[n], \ldots, y_{CHN}[n]$ contributes to the total current consumption $i_{IN}[n]$ of the audio amplifier. FIG. 5 illustrates the estimation of the predicted input current signal $i_{IN}'[n]$ in a multi-channel case. In order to account for the contribution of each channel each output signal is squared (see unit 333 in FIGS. 4 and 5) and the squared signals are added so as to form a sum signal $y_{SUM}[n]$ which represents the superposition of the output signals of all output channels. Instead of squaring the signals their absolute values may be taken as already mentioned above. The sum signal $y_{SUM}[n]$ is processed essentially in the same way as the signal y[n] in the example of FIGS. 3 and 4. The sum signals $y_{SUM}[n]$ and $x_{SUM}[n]$ may represent a weighted sum. Especially, if the loudspeakers connected to the cannels do not have the same impedance the individual signals $y_{CH1}[n], y_{CH2}[n], \ldots, y_{CHN}[n]$ (or $x_{CH1}[n], x_{CH1}[n], x_{CHN}[n]$) have to be weighted in accordance with the corresponding loudspeaker's impedance before calculating the respective sum signal. The details of the weighting is explained further below with reference to FIG. 7.

The signal $y_{SUM}[n]$ is supplied to the adaptive filter 331 that includes a FIR filter unit and an adaptation unit, whereby the adaptation unit iteratively calculates updated filter coefficients $h_k'[n]$ that represent the filter transfer function H'(z). For this purpose the adaptation unit receives the signal $y_{SUM}[n]$ and an error signal e[n] which represents the difference between the output of the adaptive filter (i.e., the estimation) and the actual current signal $i_{IN}[n]$. The iterative calculation is done in accordance with known adaptation algorithms such as, for example, a Least-Mean-Squares algorithms (LMS algorithms). A copy of the adaptive filter coefficients $h_k[n]$ is used in the filter unit 332 for filtering a sum signal $x_{SUM}[n]$ representing a superposition of the (e.g., squared) input signals x[n] of all channels. The delay unit 334 shown in FIG. 5 is optional and may be provided to account for a dead time in the transfer characteristics H(z) to be "emulated" by the adaptive filter. The dead time can be lumped into the delay unit 334, which allows for a more efficient use of the adaptive filter 331.

Figure 6:
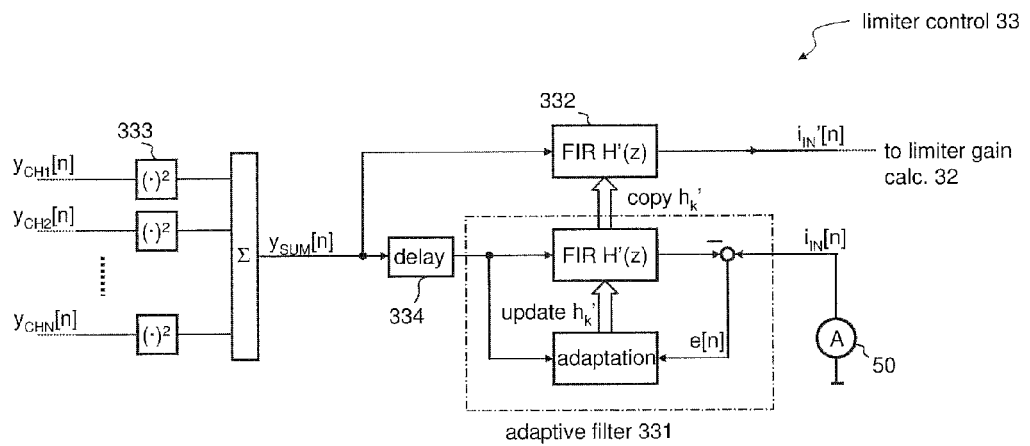
FIG. 6 illustrates an alternative to the example illustrated in FIG. 5.

FIG. 6 illustrates an alternative to the example of FIG. 5. In the limiter control unit 33 of FIG. 6 the undelayed sum signal $y_{SUM}[n]$ is fed to the filter 332 for calculating the current estimate $i_{IN}'[n+1]$ instead of the sum signal $x_{SUM}[n]$. Concerning this example it is important to notice that the above mentioned delay unit 334 (delay of $n_{delay}$ samples) is required and that the delayed signal $y_{SUM}[n-n_{delay}]$ is provided to the adaptive filter 331 whereas the undelayed signal $y_{SUM}[n]$ is provided to the filter unit 332 for calculating the current estimate $i_{IN}'[n+1]$. It should be noted that the current estimate $i_{IN}'[n+1]$ provided by the example of FIG. 4 is scaled by a factor $G_{LIM}[n]$ as compared to the current estimate $i_{IN}'[n+1]$ provided by the example of FIG. 6. However, this scaling can be considered in the limiter gain calculation and is thus unproblematic.

Figure 7:
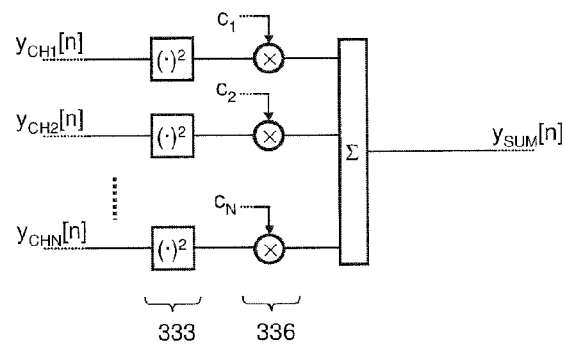
FIG. 7 illustrates the combining of the output signals to a provide a sum signal as shown in FIG. 5 further considering the loudspeaker's impedances.

FIG. 7 illustrates an enhanced example of the combining of the output signals $y_{CH1}[n], \ldots, y_{CHN}[n]$ to one sum signal $y_{SUM}[n]$ as illustrated in the examples of FIGS. 5 and 6. In accordance with FIG. 7 each one of the output signals $y_{CH1}[n], \ldots, y_{CHN}[n]$ is squared (or transformed to a positive definite signal) and then weighted (e.g., multiplied) by a corresponding weighing factor $c_1, c_2, \ldots, c_N$. Alternatively, the weighing can be done with a factor $sqrt(c_1)$ (or $sqrt(c_2)$ etc.) before the square operation. The weighing factors $c_1, c_2, \ldots, c_N$ are calculated so as to compensate for loudspeakers having different impedances connected to the different audio channels. For example, an audio channel supplying a 4 ohm loudspeaker will have to supply twice the output current than a channel supplying an 8 ohm loudspeaker when supplied with the same output signals $y_1[\ ], y_2[n]$. Consequently, the weighing factor $c_1$ for the first channel would equal two times the weighing factor for the second channel in the present example. As the loudspeaker's impedance does not significantly change during operation, the weighing factors $c_1, c_2, \ldots, c_N$ can be considered as constants. In a more sophisticated implementation the weighing factors may be frequency dependent, i.e., different weighing factors $c_{1k}, c_{2k}, c_{Nk}$ are used for different spectral ranges (spectral lines k) of the output signals $y_{CH1}[n], \ldots, y_{CHN}[n]$. Thereby, the frequency dependent weighing factors may represent the frequency dependent impedance of the respective loudspeakers. In the example of FIG. 5 the input signals $x_1[n], x_2[n], \ldots, x_N[\ ]$ may be processed the same way as the output signals (see FIG. 7), so as to form a corresponding sum signal $x_{SUM}[n]$.

For an efficient implementation the adaptive filter may be realized in the frequency domain using fast Fourier algorithms in connection with the known overlap-and-save method (see Oppenheim-Schafer: Chapter 8.7.3 Implementing Linear Time-Invariant Systems using DFT, in: Discrete Time Signal Processing, Prentice Hall, 1999). Further, in order to allow for a computationally more efficient implementation of the FIR filter 332 (see FIG. 4) the FIR transfer function H(z) can be transformed to (and thus approximated by) a computationally more efficient infinite impulse response (IIR) filter using LPC analysis which can efficiently implemented using the Levinson-Durbin recursion. Therefore, only the minimum phase component of the estimated (FIR) transfer function H'(z) has to be considered for the transformation to a corresponding IIR filter H"(z) as the phase response of the resulting IIR filter is irrelevant in the present application. This feature is included in the limiter controller 33 illustrated in FIG. 8 and entails the advantage of reduced computational complexity, as IIR filters requires significantly less coefficients as FIR filters exhibiting a similar frequency response.

Figure 8:
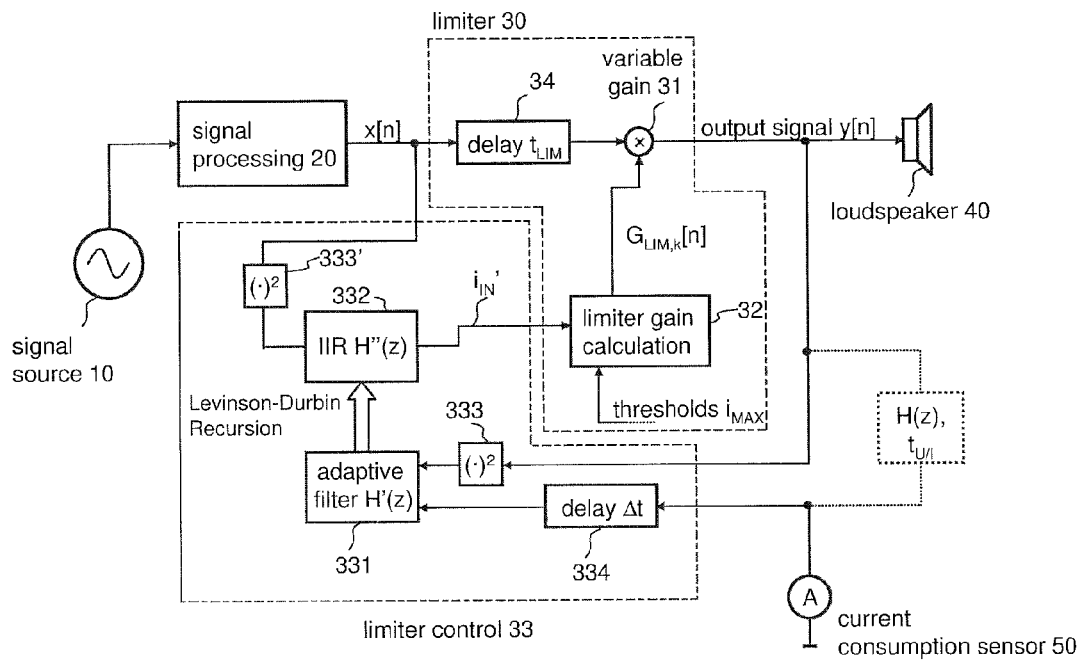
FIG. 8 illustrates the example of FIG. 4 using a frequency dependent limiter gain.

The limiter 30 included in the example of FIG. 8 differs from the limiter illustrated in the examples of FIG. 3 or 4 in that the respective limiter gain calculation unit 32 is configured to calculate a frequency dependent limiter gain $G_{LIM,k}[n]$ whereby the subscript k denotes the respective frequency band (or discrete "spectral line" as the signals are processed as discrete time and discrete frequency signals). This frequency dependent limiter gain $G_{LIM,k}[n]$ allows to reduce the gain of some spectral components of the input signals x[n] more than the gain of other components. A reduction of the limiter gain associated with a bass frequency range (e.g., frequencies below 180 Hz) will have a greater impact on the current consumption as a reduction of the limiter gain associated with the treble frequency range (e.g., greater than 1 kHz).

In accordance with a further example of the invention the frequency dependent limiter gain $G_{LIM,k}[n]$ exhibits a frequency characteristics that (at least approximately) matches the (optionally scaled) frequency characteristics of the inverse of frequency response H(z) estimated by the adaptive filter 331. When, as mentioned above, using the Levinson-Durbin recursion to "simplify" the estimates FIR filter to an IIR filter, the inverse may be easily obtained by interchanging nominator and denominator of the transfer function of the IIR filter H"(z) (filter 332). However, the mentioned "simplification" of the estimated FIR filter is not necessary for implementing a frequency dependent limiter gain $G_{LIM,k}[n]$; the limiter gain calculation unit 32 may use a different strategy to calculate the frequency dependent limiter gain $G_{LIM,k}[n]$. Further, different limiter thresholds $i_{MAX,k}$ may be provided for the respective frequency bands (spectral lines) and typically an attenuation of the low frequencies has a greater impact on the current consumption than an attenuation of the higher frequencies. When attenuating only the low frequencies, however, the perceived loudness will decrease not so much as if a broadband attenuation would be used as in the example of FIG. 3 or 4.

In the case of multiple audio channels a sum signal $y_{SUM}[n]$ is formed from all output signals $y_{CH1}[n], y_{CHN}[n], y_{CHN}[n]$ that contribute to the total current consumption $i_{IN}[n]$ of the audio amplifier. The resulting sum signal is fed into the adaptive filter 331 which is a SISO system (single input single output system) in the example of FIGS. 5 and 6. However, as an alternative to summing the output signals a multidimensional adaptive filter (i.e., a MISO system, multiple input single output system) may be used to estimate a transfer vector representing the transfer characteristics from the output current vector {signals $y_{CH1}[n], y_{CH2}[n], \ldots, y_{CHN}[n]$} to the resulting input current consumption $i_{IN}[n]$ (or alternatively the output current consumption). However, in practical implementations the example of FIGS. 5 and 6 seems to be sufficient and easier to implement.

Although various examples to realize the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. Such modifications to the inventive concept are intended to be covered by the appended claims. Furthermore the scope of the invention is not limited to automotive applications but may also be applied in any other environment, e.g., in consumer applications like home cinema or the like and also in cinema and concert halls or the like.

Although the present invention has been illustrated and described with respect to several preferred embodiments thereof, various changes, omissions and additions to the form and detail thereof, may be made, without departing from the spirit and scope of the invention.

What is claimed is:

1. An audio amplifier comprising:
   a variable gain amplifier that receives an input audio signal x[n] and amplifies the input audio signal x[n] by a limiter gain ($G_{LIM}[n]$) to provide an amplified output signal y[n];
   a sensor that senses and provides an audio amplifier current (iIN[n]) signal indicative of the current provided by the audio amplifier;
   a control unit that includes an adaptive filter that receives a first signal indicative of the input audio signal x[n] and a second signal indicative of the audio amplifier current (iIN[n]), and provides an estimated current signal (iIN'[n]) indicative of an estimation of the audio amplifier current; and
   a limiter gain calculation unit that calculates, dependent on the estimated current signal (iIN'[n]), the limiter gain ($G_{LIM}[n]$) such that the amplified output signal does not exceed a threshold current value (iMAX).

2. The audio amplifier of claim 1, where
   the control unit also receives the amplified output signal y[n] and processes the amplified output signal y[n], the input signal x[n] and the second signal indicative of the audio amplifier current (iIN[n]) to provide the estimated current signal (iIN'[n]).

3. The audio amplifier of claim 1, further including
   a delay unit coupled to the variable gain amplifier.

4. The audio amplifier of claim 1 comprising at least two audio channels, one variable gain amplifier being associated with each audio channel and being configured to amplify a respective input signal by the limiter gain; where
   the control unit includes a signal combining unit configured to combine input or output signals of the at least two audio channels so as to provide a sum signal;
   the adaptive filter is configured to estimate a transfer function describing transfer characteristics from the sum signal to total output current of the audio amplifier.

5. The audio amplifier of claim 4 where the control unit further includes a delay unit coupled upstream to the adaptive filter.

6. The audio amplifier of claim 1, where the limiter gain is frequency dependent.

7. A method for limiting current consumption of an audio amplifier, comprising:
   amplifying an input audio signal x[n] by a variable limiter gain to provide an amplified output signal;
   sensing audio amplifier current with a current sensor and providing an audio amplifier current signal indicative thereof;
   processing a first signal indicative of the input audio signal x[n] and a second signal indicative of the audio amplifier current signal with an adaptive filter, and providing an estimated current signal (iIN'[n]) indicative of an estimation of the audio amplifier current signal, and
   calculating the variable limiter gain based upon the estimated current signal (iIN'[n]) and limiting the variable limiter gain to ensure that the amplified output signal does not exceed a threshold current value.

8. The method of claim 7, where the step of providing the estimated current signal (iIN'[n]) comprises:
   iteratively adapting finite impulse response (FIR) filter coefficients so as to emulate a transfer function representing transfer characteristics from the amplified output signal to the input audio signal to the current sensor; and
   using the transfer function to calculate the estimated current signal (iIN'[n]).

9. The method of claim 8 where the step of using the transfer function to calculate the estimated current signal comprises:
   transforming the iteratively adapted FIR filter coefficients into corresponding infinite impulse response (IIR) filter coefficients so as to obtain an IIR filter having approximately the same transfer characteristics as a minimum phase part of the FIR filter.

10. The method of claim 7 where the variable limiter gain is frequency dependent.

11. The method of claim 9 where the variable limiter gain is frequency dependent and where the step of calculating the variable limiter gain comprises:
- calculating an inverse transfer function of the FIR or the IIR filter; and
- calculating the variable limiter gain such that frequency characteristics of the variable limiter gain at least approximately matches frequency characteristics of the inverse transfer function of the FIR or the IIR filter.

12. The method of claim 7, where the audio amplifier comprises at least two audio channels, the method further comprises:
- combining signals of the at least two audio channels so as to provide a sum signal;
- estimating a transfer function describing transfer characteristics from the sum signal to the audio amplifier current signal.

13. The method of claim 12 where the step of combining comprises a weighted summation of the input or the output signals of the at least two audio channels, where weighting factors are chosen so as to consider loudspeakers of different impedances at different audio channels, the weighting factors being frequency dependent.

14. The method of claim 8, where the step of sensing the audio amplifier current comprises sensing at least one of input current consumption of the audio amplifier or total output current of the audio amplifier such that the audio amplifier current signal is indicative of at least one of input current consumption of the audio amplifier or total output current of the audio amplifier.

\* \* \* \* \*